US007634696B2

(12) United States Patent
Mulligan

(10) Patent No.: US 7,634,696 B2
(45) Date of Patent: Dec. 15, 2009

(54) SYSTEM AND METHOD FOR TESTING MEMORY

(75) Inventor: Daniel P. Mulligan, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 243 days.

(21) Appl. No.: 11/070,970

(22) Filed: Mar. 3, 2005

(65) Prior Publication Data

US 2006/0200712 A1 Sep. 7, 2006

(51) Int. Cl.
*G11C 29/00* (2006.01)
(52) U.S. Cl. .................................. 714/718; 714/722
(58) Field of Classification Search ......... 714/718–724; 365/200–201
See application file for complete search history.

(56) References Cited

U.S. PATENT DOCUMENTS

| | | | | |
|---|---|---|---|---|
| 4,368,532 A | * | 1/1983 | Imazeki et al. | 714/722 |
| 4,686,456 A | * | 8/1987 | Furuyama et al. | 714/722 |
| 4,715,034 A | | 12/1987 | Jacobson | |
| 4,782,486 A | | 11/1988 | Lipcon et al. | |
| 4,873,705 A | | 10/1989 | Johnson | |
| 5,446,741 A | | 8/1995 | Boldt et al. | |
| 6,219,286 B1 | * | 4/2001 | Fuchigami et al. | 365/200 |
| 6,532,556 B1 | * | 3/2003 | Wong et al. | 714/702 |
| 6,550,023 B1 | * | 4/2003 | Brauch et al. | 714/42 |
| 6,728,911 B1 | | 4/2004 | Maynard et al. | |
| 7,415,640 B1 | * | 8/2008 | Zorian et al. | 714/711 |

OTHER PUBLICATIONS

"Memory Testing," Memory Testing.1.
"Memory Testing," DS&VLSI Testing, pp. 1-28.
"Chapter 9 Memory Testing," Cheng-Wen Wu, Lab for Reliable Computing (LaRC), EE, NTHU, 2002.
"Lecture 27 Memory Delay-Fault Built-In Self-Testing," Agrawal & Bushnell, VLSI Test: Lecture 27 2001.
"Memory Testing," Cheng-Wen Wu, Lab for Reliable Computing (LaRC), EE, NTHU, 2002 .

* cited by examiner

*Primary Examiner*—Kevin L Ellis
*Assistant Examiner*—Steve Nguyen
(74) *Attorney, Agent, or Firm*—Toler Law Group

(57) ABSTRACT

In some embodiments, a method for testing a memory having a plurality of bits is provided and includes initializing each value in a first register to zero. Next, each value in a second register is initialized to one. Further, each bit in the memory is initialized to zero. A logical OR operation is applied to each bit in the memory with a bit value as the first operand and a corresponding register value in the first register as the second operand. Additionally, the method includes initializing each bit in the memory to one. Also, a logical AND operation is applied to each bit in the memory with the bit value as the first operand and a corresponding register value as the second operand.

14 Claims, 6 Drawing Sheets

SYSTEM AND METHOD FOR TESTING MEMORY

FIELD OF THE DISCLOSURE

The present disclosure relates generally to methods for testing solid-state memory.

BACKGROUND

Increasingly, the consumer market is demanding portable electronic devices, such as personal digital assistants (PDA), MP3 players, portable storage systems, advanced wireless telephones, cameras, and other handheld devices. Traditional non-volatile storage mediums, such as hard drives, floppy drives and other storage devices, are generally unsuitable for portable devices. These typical devices generally have moving parts and as such are subject to mechanical failure. In addition, these devices are bulky and consume a large amount of energy. As a result, developers are turning to solid-state non-volatile memory devices, such as electrically erasable programmable read only memory (EEPROM) and flash memory, for use in portable products.

Typically, each time a user turns on one of these portable electronic devices, the memory therein is tested in order to locate and repair bits that may have failed. As the size of the memory increases, the time required to test the memory also increases. As such, an improved system and method for testing solid-state storage is desirable.

DETAILED DESCRIPTION OF THE DRAWING(S)

Figure 1:
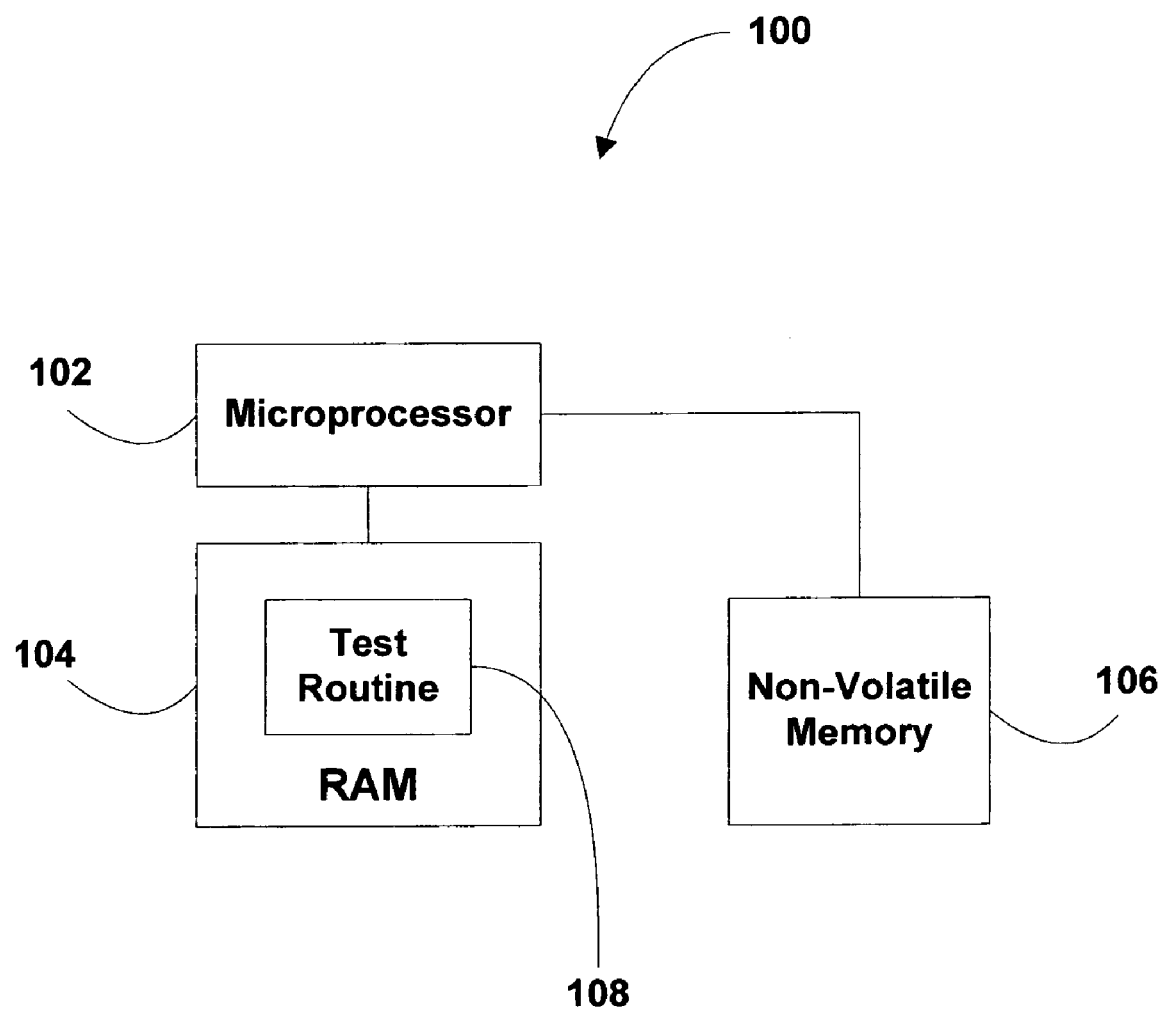
FIG. 1 is a block diagram of a system for testing a memory.

A method for testing a memory comprising a plurality of bits is provided and includes initializing each value in a first register to zero. Also, each bit in the memory is initialized to zero. A logical OR operation is applied to each bit in the memory with a bit value as a first operand and a corresponding register value in the first register as a second operand. The method further includes determining whether a result value of the logical OR operation for any bit in the memory is equal to one.

In a particular embodiment, the results of the logical OR operation are saved in the first register. Further, in a particular embodiment, the method also includes initializing each value in a second register to one. Thereafter, each bit in the memory is initialized to one. A logical AND operation is applied to each bit in the memory location with the bit value as the first operand and a corresponding register value as the second operand. Moreover, the method includes determining whether a result value of the logical AND operation for any bit is equal to zero.

In a particular embodiment, the results of the logical AND operation are saved in the second register. Additionally, the first register and the second register are combined to yield a repair control register. The memory can be repaired at least partially based on the repair control register. In a particular embodiment, the method can be executed by a microprocessor that is coupled to the memory. Further, in a particular embodiment, the memory can be a random access memory. Also, the memory can be a flash memory. In a particular embodiment, the method can be executed once during a microprocessor boot cycle. In another embodiment, the method can be executed during a first initialization of the memory from an unpowered state. Moreover, in a particular embodiment, the method takes less than 100 milliseconds to completely execute.

In another embodiment, a method for testing a memory having a plurality of bits is provided and includes initializing each value in a first register to zero. Next, each value in a second register is initialized to one. Further, each bit in the memory is initialized to zero. A logical OR operation is applied to each bit in the memory with a bit value as the first operand and a corresponding register value in the first register as the second operand. Additionally, the method includes initializing each bit in the memory to one. Also, a logical AND operation is applied to each bit in the memory with the bit value as the first operand and a corresponding register value as the second operand.

In yet another embodiment, the system includes a memory device and a microprocessor coupled to the memory device. The microprocessor includes access to a memory testing program that is executable by the microprocessor. The memory testing program includes a first instruction to store a first predefined test value into the memory device. Moreover, the memory testing program includes a second instruction to perform a logical OR operation between the predefined test value and a first memory value retrieved from the memory device. The memory testing program also includes a third instruction to store a second predefined test value into the memory device. Additionally, the memory testing device includes a fourth instruction to perform a logical AND operation between the second predefined test value and a second memory value retrieved from the memory device.

FIG. 1 shows an exemplary, non-limiting embodiment of a system, designated 100. As illustrated in FIG. 1, the system 100 includes a microprocessor 102. A random access memory (RAM) 108 is coupled to the microprocessor 102. Further, a non-volatile memory 106 is coupled to the microprocessor 102. In a particular embodiment, the non-volatile memory 106 is an electrically-erasable programmable read-only memory (EEPROM) such as a flash memory.

FIG. 1 also shows a test routine 108 that is embedded in the RAM 104. In a particular embodiment, the test routine 108 includes a plurality of test instructions that can be executed by the microprocessor 102 in order to test the non-volatile memory 106. The test instructions are described in detail below in conjunction with FIG. 4 and FIG. 5 and can include one or more logical OR operations and one or more logical AND operations that can be executed to test the individual bits within the non-volatile memory.

Figure 2:
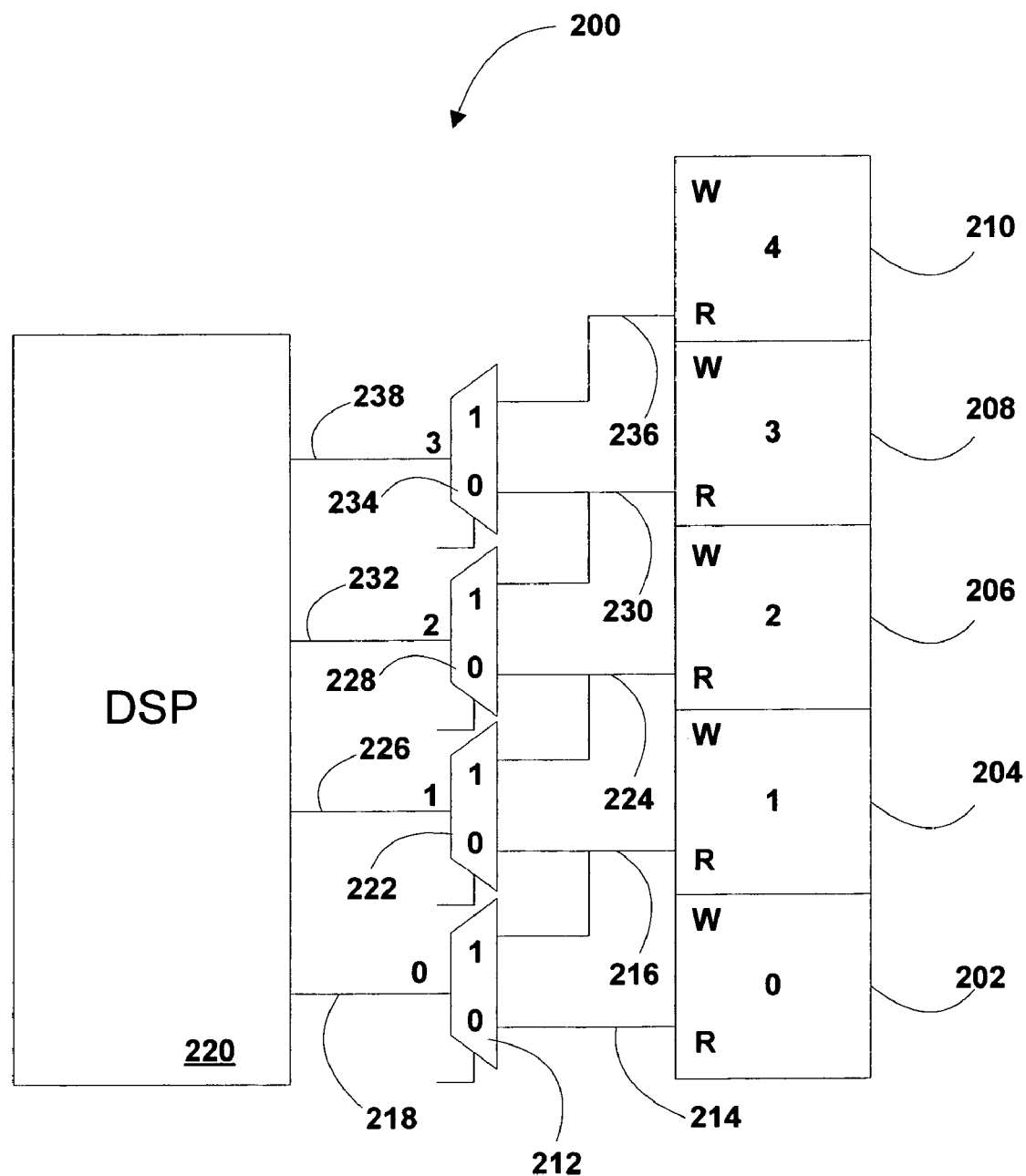
FIG. 2 is a representation of a solid state memory configured for reading data therefrom.

Referring now to FIG. 2, an exemplary, non-limiting embodiment of a memory system is shown and is designated 200. As shown the memory system includes a zeroth bit 202, a first bit 204, a second bit 206, a third bit 208, and a fourth bit 210. FIG. 2 only depicts five bits for clarity and ease of discussion, but the memory system 200 can include more than five bits. For example, the memory system 200 can include nine bits (0 to 8), seventeen bits (0 to 16), twenty-five bits (0 to 24), thirty-three bits (0 to 32), sixty-five bits (0 to 64), one hundred and twenty-nine bits (0 to 128), etc.

FIG. 2 further illustrates a zeroth multiplexer (MUX) 212. The zeroth MUX 212 is connected to a zeroth data output line 214 from the zeroth bit 202 and is connected to a first output data line 216 from the first bit 204. The zeroth MUX 212 is further connected to a zeroth data input line 218 that is connected to a digital signal processor (DSP) 220. A first MUX 222 is connected to the first data output line 216 and a second data output line 224 from the second bit 206. Further, the first MUX 222 is connected to a first data input line 226 that in turn, is connected to the DSP 220.

As depicted in FIG. 2, the memory system 200 further includes a second MUX 228 that is connected to the second data output line 224 and a third data output line 230 from the third bit 208. The second MUX 228 is also connected to the DSP 220 via a second data input line 232. Finally, a third MUX 234 is connected to the third data output line 230 and to a fourth data output line 236 from the fourth bit 210. Also, the third MUX 234 is connected to a third data input line 238 that leads to the DSP 220.

In a particular embodiment, each MUX 212, 222, 228, 234 is connected to its respective pair of bits 202, 204, 206, 208, 210 in order to allow the DSP 220 to read data from the bits 202, 204, 206, 208, 210. Further, each MUX 212, 222, 228, 234 can be switched by inputting a zero (0) or a one (1) thereto. For example, when the zeroth MUX 212 is set to 0, data is read from the zeroth bit 202. Conversely, when the zeroth MUX 212 is set to 1, data is read from the first bit 204.

In an illustrative embodiment, the MUXes 212, 222, 228, 234 can be controlled by a binary MUX read register that includes the setting for each MUX 212, 222, 228, 234. The MUX read register can be input to the MUXes 212, 222, 228, 234 by the DSP 220. For example, when the MUX read register is set at {0, 0, 0, 0}, data is read from the zeroth bit 202, the first bit 204, the second bit 206, and the third bit 208. When the MUX read register is set at {0,0,0,1}, data is read from the zeroth bit 202, the first bit 204, the second bit 206, and the fourth bit 210. Also, when the MUX read register is set at {0,0,1,1} data is read from the zeroth bit 202, the first bit 204, the third bit 208, and the fourth bit 210. When the MUX read register is set at {0,1,1,1}, data is read from the zeroth bit 202, the second bit 206, the third bit 208, and the fourth bit 210. Finally, when the MUX read register is set at {1,1,1,1}, data is read from the first bit 204, the second bit 206, the third bit 208, and the fourth bit 210.

Figure 3:
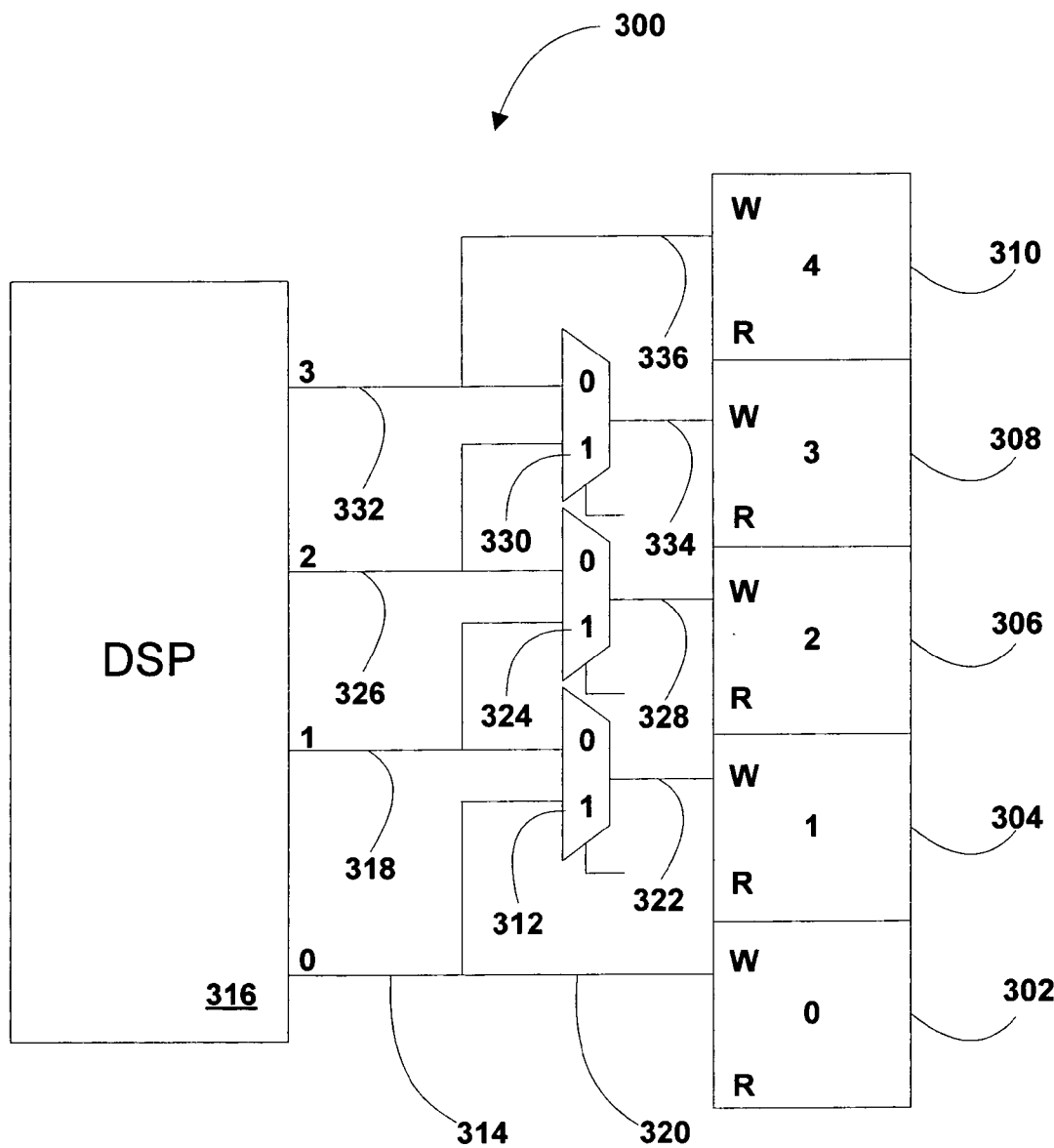
FIG. 3 is a representation of a solid state memory configured for writing data thereto.

FIG. 3 shows another exemplary, non-limiting embodiment of a memory system that is generally designated 300. As shown, the memory system includes a zeroth bit 302, a first bit 304, a second bit 306, a third bit 308, and a fourth bit 310. FIG. 3 only depicts five bits, but the memory system 300 can include more than five bits. For example, the memory system 300 can include nine bits (0 to 8), seventeen bits (0 to 16), twenty-five bits (0 to 24), thirty-three bits (0 to 32), sixty-five bits (0 to 64), one hundred and twenty-nine bits (0 to 128), etc.

FIG. 3 depicts a zeroth MUX 312 that is connected to a zeroth data output line 314 from a DSP 316 and a first data output line 318 from the DSP 316. As illustrated in FIG. 3, the zeroth data output line 314 is also connected to a zeroth data input line 320 that is connected to the zeroth bit 302. Further, the zeroth MUX 312 is connected to a first data input line 322 that connects to the first bit 304. The memory system 300 includes a first MUX 324 that is connected to the first data output line 318 from the DSP 316 and a second data output line 326 from the DSP 316. The first MUX 322 is also connected to a second data input line 328 that connects to the second bit 306. Further, the memory system 300 includes a second MUX 330 that is connected to the second data output line 326 from the DSP 316. The second MUX 330 is also connected to a third data output line 332 from the DSP 316 and a third data input line 334 that connects to the third bit 308. As shown, the third data output line 332 from the DSP is also connected to a fourth data input line 336 that connects to the fourth bit 310.

In a particular embodiment, each MUX 312, 324, 330 is connected to the bits 302, 304, 306, 308, 310 in order to allow the DSP 316 to write data to the bits 302, 304, 306, 308, 310. Further, each MUX 312, 324, 330 can be switched by inputting a zero (0) or a one (1) thereto. For example, when the zeroth MUX 312 is set to 0, data from the zeroth data output line 314 is written to the zeroth bit 302 and data from the first data output line 318 is written to the first bit 304. Conversely, when the zeroth MUX 312 is set to 1, data from the zeroth data output line 314 is written to the zeroth bit 302 and the first bit 304.

In an illustrative embodiment, the MUXes 312, 324, 330 can be controlled by a binary MUX write register that can include the setting for each MUX 312, 324, 330 and can be input to the MUXes 312, 324, 330 by the DSP 316. For example, when the MUX write register is set at {0, 0, 0}, data from the zeroth data output line 314 is written to the zeroth bit 302, data from the first data output line 318 is written to the first bit 304, data from the second data output line 326 is written to the second bit 306, and data from the third data output line 332 is written to the third bit 308 and the fourth bit 310. Thus, if there is any indication that the third bit 308 has failed the data from the third data output line 332 is be retrieved from the fourth bit 310 during a read cycle.

When the MUX write register is set at {0,0,1}, data from the zeroth data output line 314 is written to the zeroth bit 302, data from the first data output line 318 is written to the first bit 304, data from the second data output line 326 is written to the second bit 306 and the third bit 308, and data from the third data output line 332 is written to the fourth bit 310. As such, if the second bit 306 fails, the redundant data from the second data output line 326 is read from the third bit 308 and the data from the third data output line 332 is read from the fourth bit 310.

When the MUX write register is set at {0, 1, 1}, data from the zeroth data output line 314 is written to the zeroth bit 302, data from the first data output line 318 is written to the first bit 304 and the second bit 306, data from the second data output line 326 is written to the third bit 308, and data from the third data output line 332 is written to the fourth bit 310. As such, if the first bit 304 fails, the redundant data from the first data output line 318 is read from the second bit 306, data from the second data output line 318 is read from the third bit 308, and the data from the third data output line 332 is read from the fourth bit 310.

Finally, when the MUX write register is set at {1, 1, 1}, data from the zeroth data output line 314 is written to the zeroth bit 302 and the first bit 304, data from the first data output line 318 is written to the second bit 306, data from the second data output line 326 is written to the third bit 308, and data from the third data output line 332 is written to the fourth bit 310. As such, if the zeroth bit 302 fails, the redundant data from the zeroth data output line 314 is read from the first bit 304, data from the first data output line 318 is read from the second bit 306, data from the second data output line 318 is read from the third bit 308, and the data from the third data output line 332 is read from the fourth bit 310.

Figure 4:
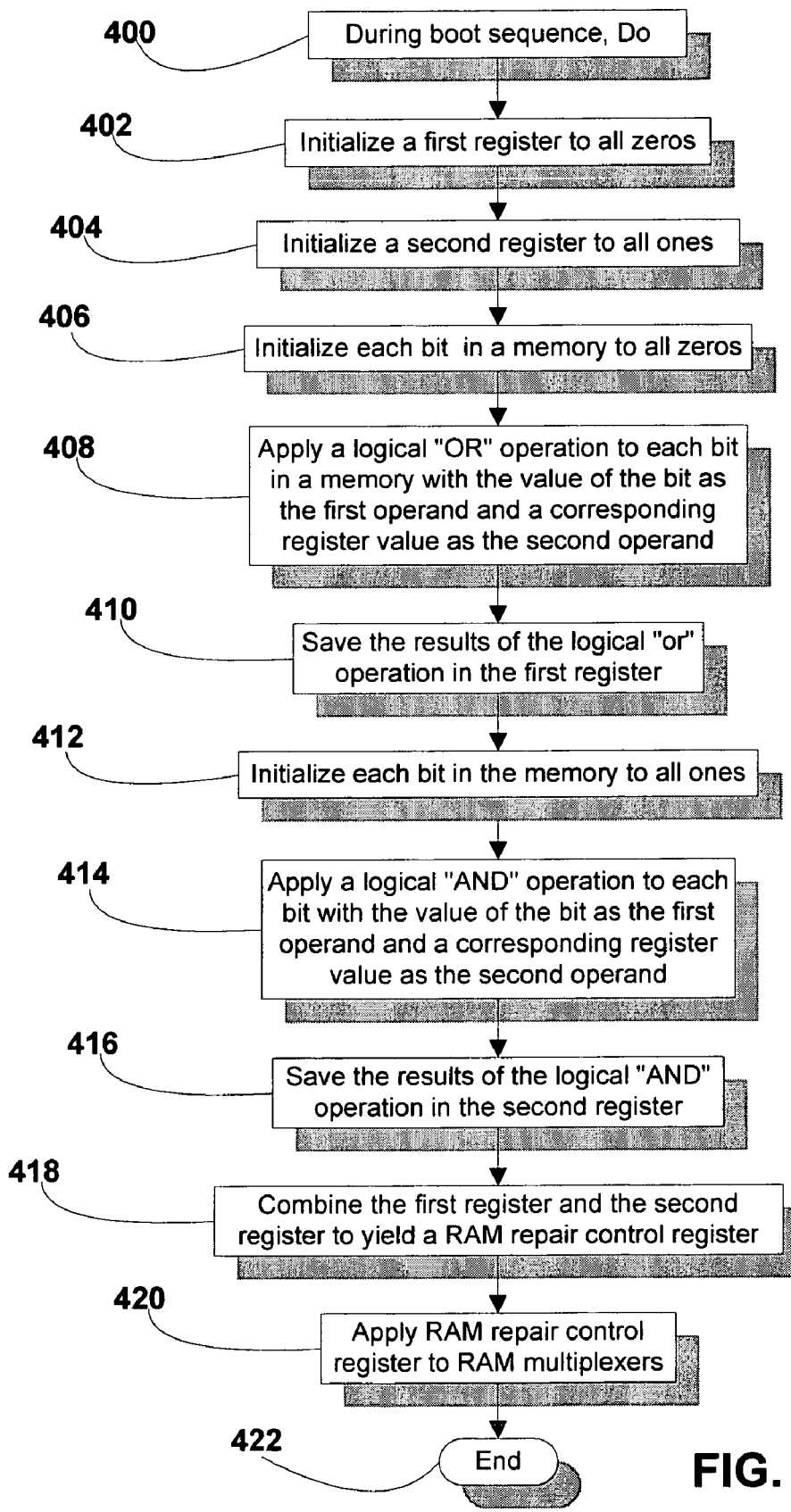
FIG. 4 is a flow chart illustrating an exemplary method for testing a solid-state memory.

FIG. 4 illustrates a method for testing a memory, e.g., the memory shown in FIG. 2, FIG. 3, or both. The method commences at block 400 where during a boot sequence, the following steps can be performed. At block 402, a microprocessor coupled to the memory initializes a first register to all zeros. Then, at block 404, the microprocessor initializes a second register to all ones. At block 406, the microprocessor initializes each bit in the memory to all zeros. Moving to block 408, the microprocessor applies a logical OR operation to each bit in the memory with the value of the bit as the first operand and a corresponding register value as the second operand. At block 410, the microprocessor saves the results of the logical OR operation in the first register.

Proceeding to block 412, the microprocessor initializes each bit in the memory to all ones. Thereafter, at block 414, the microprocessor applies a logical AND operation to each bit with the value of the bit as the first operand and a corresponding register value as the second operand. At block 416, the microprocessor saves the results of the logical AND operation in the second register. Moving to block 418, the microprocessor combines the first register and the second register to yield a RAM repair control register. At block 420, the microprocessor applies the RAM repair control register to a plurality of RAM multiplexers. The logic then ends at state 422.

In a particular embodiment, the RAM repair control register includes a MUX read register for reading data from the memory and a MUX write register for writing data to the memory. As such, the RAM repair control register is a binary register having the switch values for the MUXes for reading and the MUXes for writing to the memory. Based on the testing logic, if a particular bit has failed the RAM repair control register can switch the MUXes, as described above, to ensure that the failed bit does not get written to or read from during operation of the device in which the memory is installed.

In a particular embodiment, the method can be a 14N test in which each memory location is accessed fourteen times. Appendix I shows an exemplary, non-limiting test routine in which each memory location is accessed fourteen times. In another embodiment, the method can be a 4N test in which each memory location is accessed four times. Appendix II shows an exemplary, non-limiting test routine in which each memory location is accessed four times.

In a particular embodiment, each of the read and compare operations of the method described herein takes two processor cycles and significantly reduces the time required to test the memory during a boot cycle. Further, the present embodiment provides a power on self-test sequence that can be used to test RAM on a chip. The test routine provided above can be included in the on-chip ROM and can be executed during every boot sequence of the RAM. In an illustrative embodiment, six on-chip RAMs are provided, e.g., 3 XRAMs (PXRAMs) and 3 YRAMs (PYRAMs). Moreover, the on-chip RAMs are visible to the DSP as 96 kwords of 24 bit wide memory, however, the RAM can be implemented as six instances of 16 kwords of 25 bit wide memory.

Also, in an illustrative embodiment, the method described above attempts to find defects in the on-chip RAMs and can use the $25^{th}$ bit in each RAM to attempt to repair any defects found. This can be achieved by shifting the MUXes to write around or read around the defective bit. For example, by inputting a MUX read register to an on-chip RAM having the following binary values {0,0,0,1,1,1,1,1,1,1,1,1,1,1,1, 1,1,1, 1,1,1,1,1}, every bit above the third bit is shifted one location up and the now-failed third bit is bypassed. In other words, a processor reading from the on-chip RAM will treat the fourth bit as the third bit, the fifth bit as the fourth bit, the sixth bit as the fifth bit, etc., and the spare twenty-fifth bit as the twenty-fourth bit.

Further, by inputting a MUX write register to an on-chip RAM having the following binary values {0,0,0, 1,1,1,1,1,1, 1,1,1,1,1,1,1,1,1,1,1,1,1,1,1}, every bit above the third bit is shifted one location up and data normally written to the third bit can be written to the now-failed third bit and the fourth bit. The system will treat the fourth bit as the third bit. Moreover, every bit above the third bit gets shift up one location, i.e., the fourth bit is shifted to the fifth bit, fifth bit is shifted to the sixth bit, etc., and the twenty-fourth bit is shifted to the spare twenty-fifth bit.

In a particular embodiment, there is a different subroutine for testing the XRAMs and the YRAMs. Both subroutines are very similar, except one refers to X memory and one refers to Y memory. Appendix III provides an exemplary, non-limiting embodiment of a routine for serially testing 3 XRAMs and 3 YRAMs. Appendix IV provides an exemplary, non-limiting embodiment of a subroutine for testing X memory. In the subroutine shown in Appendices IV, each memory location is accessed fourteen times.

Figure 5:
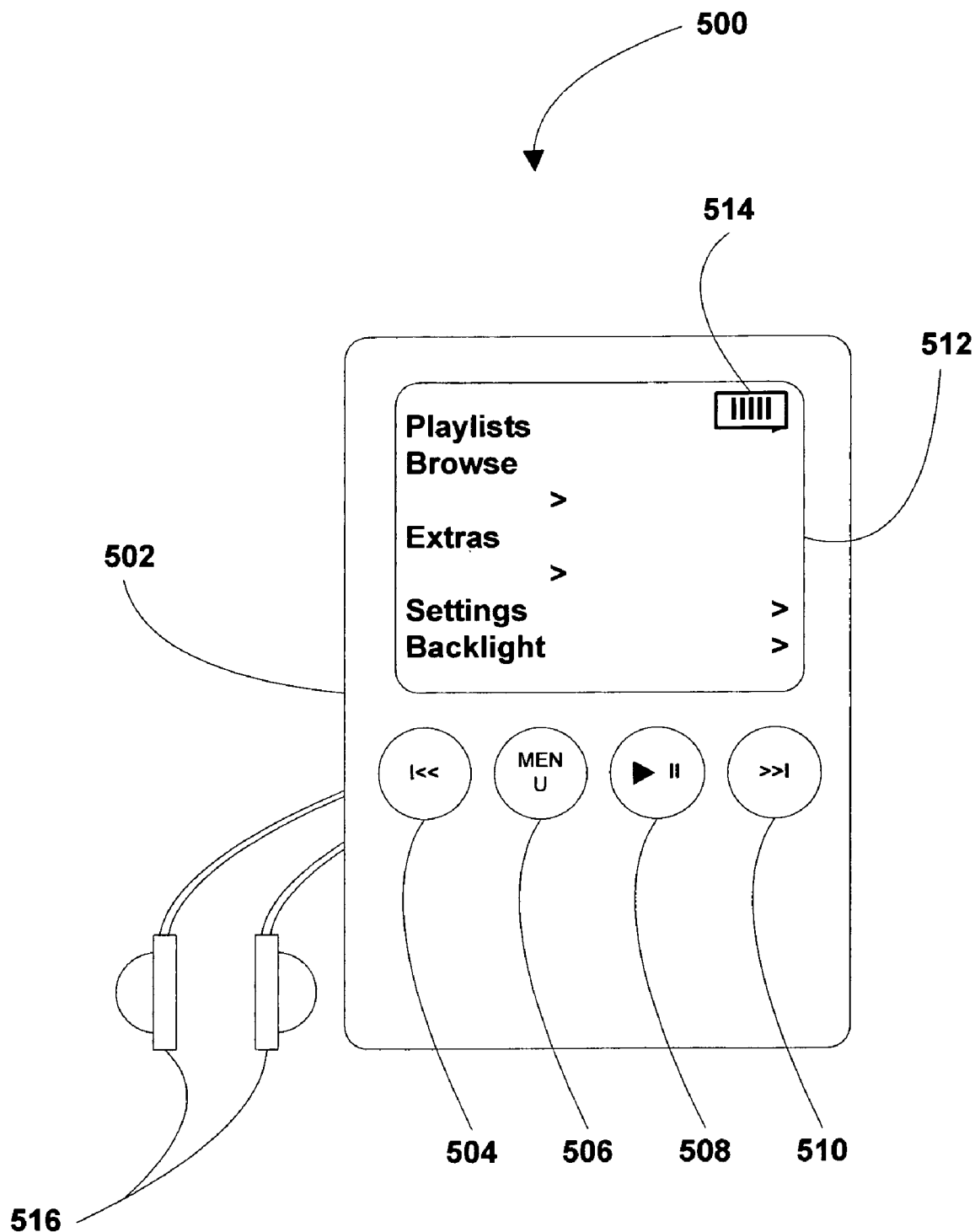
FIG. 5 is a plan view of a portable MP3 player.

Referring to FIG. 5, a portable electronic device, e.g., a device for playing media stored using the moving picture experts group audio layer 3 (MP3) format, is shown and is generally designated 500. As illustrated in FIG. 5, the device, a.k.a., an MP3 player 500 includes a housing 502. In an illustrative embodiment, the MP3 player 500 includes a rewind button 504, a menu button 506, a play/pause button 508, and a fast forward button 510. As shown, each of these buttons 504, 506, 508, 510 can be incorporated into the front of the housing 502. Moreover, as shown in FIG. 5, the MP3 player 500 can include a display 512 that can also be incorporated into the front of the housing 502. FIG. 5 further indicates that the MP3 player 500 can include a power level indicator 514 that can indicate the power remaining in a power supply for the MP3 player 500. In a particular embodiment, the MP3 player 500 can also include a set of headphones 516 that can be used to listen to music being played by the MP3 player 500.

Figure 6:
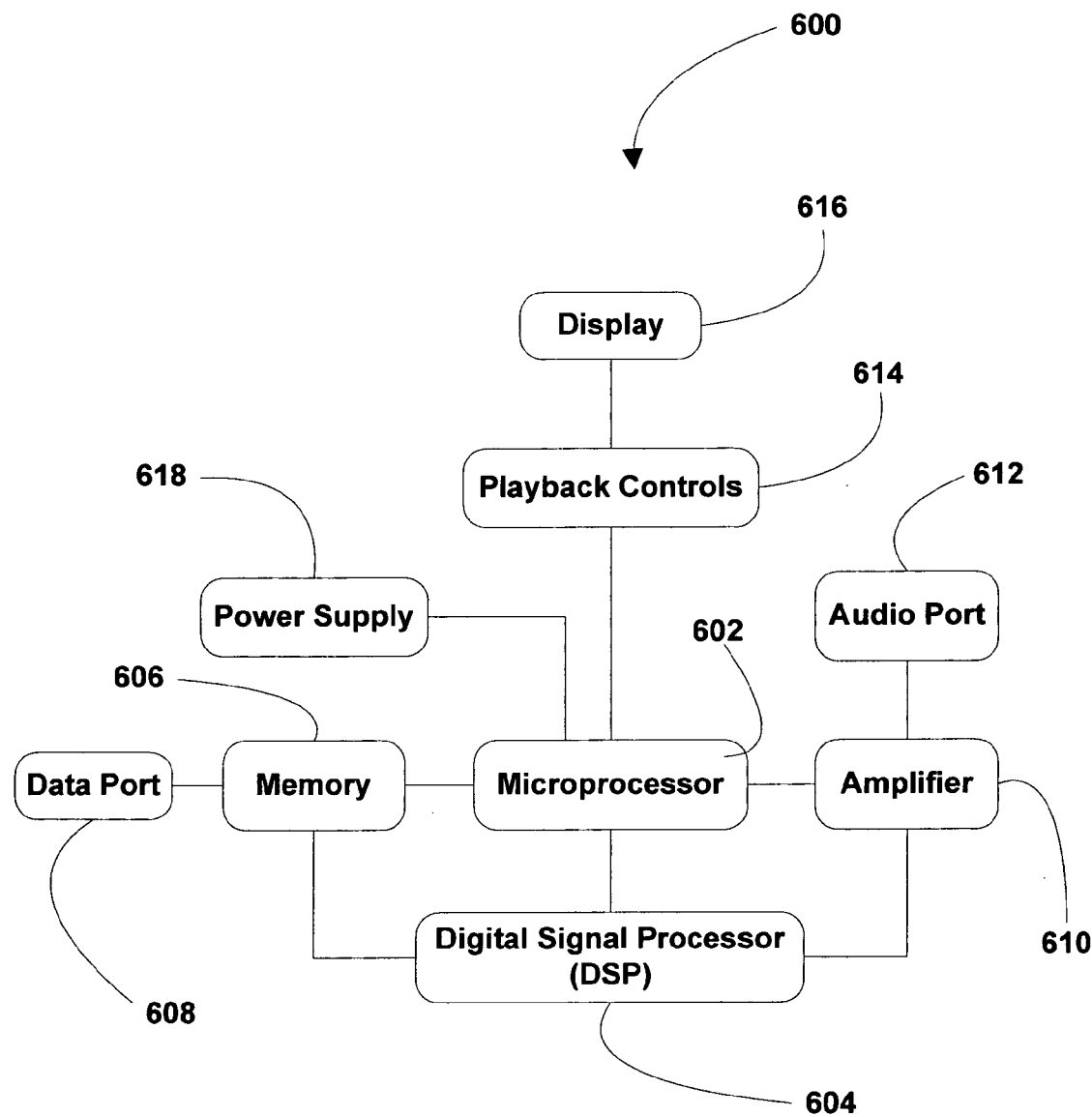
FIG. 6 is a block diagram of a portable MP3 player.

FIG. 6 illustrates a schematic diagram of an MP3 player 600. As indicated in FIG. 6, the MP3 player can include a microprocessor 602. A digital signal processor (DSP) 604 can be connected to the microprocessor 602. Further, a memory, 606 can be connected to the microprocessor 602 and the DSP 604. In an illustrative embodiment, the memory 606, is a non-volatile memory, such as a solid-state memory. For example, the memory 606 can be a flash memory device or electrically erasable programmable read only memory (EEPROM).

As further shown in FIG. 6, a data port 608, e.g., a universal serial bus (USB) port, is connected to the memory 606. Music can be downloaded from or uploaded to the memory 606 via the data port 608. Additionally, an amplifier 610 can be connected to the microprocessor 602 and the DSP 604. As depicted, an audio port 612 can be connected to the amplifier 610. In a particular embodiment, the audio port 612 is configured to receive a headphone jack connected to a set of headphones.

FIG. 6 also depicts a set of playback controls 614, e.g., a play button, a pause button, a stop button, a rewind button, a fast forward button, a display button, etc. In a particular embodiment, the playback controls 614 can be used to control the operation of the MP3 player. FIG. 6 also shows a display 616 that is connected to the microprocessor 602 via the playback controls 614. In an illustrative embodiment, a power supply 618 can be connected to the microprocessor 602 and provides power to the various components of the MP3 player 600. In a particular embodiment, the power supply 618 can be a direct current (DC) power supply, e.g., one or more alkaline batteries, or one or more rechargeable batteries. Alternatively, the power supply 618 can be an alternating current (AC) power supply that is converted into a DC power supply.

In an illustrative embodiment, the memory 606 within the MP3 player can be tested as described above in order to locate any bits within the memory 606 that appear to have failed and allow the DSP 604 to read and write around those failed bits within the memory 606. Accordingly, the quality of the operation of the MP3 player can be increased.

With the configuration of structure disclosed herein, the system and method for testing memory can efficiently test memory using a general purpose processor. For example, by keeping the results of the OR operations and the AND operations within separate registers the efficiency of testing the memory with the general purpose processor is increased.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

APPENDIX I

Exemplary 14N Test.

```
//================================================================
// 14N version of the algorithm
reg_a = $000000;
reg_b = $FFFFFF;
for (mem_addr=0; mem_addr<max; addr++) {
    wr(mem_addr, $000000);          // Access #1
}
for (mem_addr=0; mem_addr<max; addr++) {
    rd(mem_addr, tempreg);          // Access #2, expecting $000000
    reg_a = (tempreg OR reg_a);     // Set bit in reg_a for any error
    wr(mem_addr, $FFFFFF);          // Access #3
    rd(mem_addr, tempreg);          // Access #4, expecting $FFFFFF
    reg_b = (tempreg AND reg_b);    // Clear bit in reg_b for any error
}
for (mem_addr=0; mem_addr<max; addr++) {
    rd(mem_addr, tempreg);          // Access #5, expecting $FFFFFF
    reg_b = (tempreg AND reg_b);    // Clear bit in reg_b for any error
    wr(mem_addr, $000000);          // Access #6
    rd(mem_addr, tempreg);          // Access #7, expecting $000000
    reg_a = (tempreg OR reg_a);     // Set bit in reg_a for any error
}
for (mem_addr=max-1; mem_addr>=0; addr--) {
    rd(mem_addr, tempreg);          // Access #8, expecting $000000
    reg_a = (tempreg OR reg_a);     // Set bit in reg_a for any error
    wr(mem_addr, $FFFFFF);          // Access #9
    rd(mem_addr, tempreg);          // Access #10, expecting $FFFFFF
    reg_b = (tempreg AND reg_b);    // Clear bit in reg_b for any error
}
for (mem_addr=max-1; mem_addr>=0; addr--) {
    rd(mem_addr, tempreg);          // Access #11, expecting $FFFFFF
    reg_b = (tempreg AND reg_b);    // Clear bit in reg_b for any error
    wr(mem_addr, $000000);          // Access #12
    rd(mem_addr, tempreg);          // Access #13, expecting $000000
    reg_a = (tempreg OR reg_a);     // Set bit in reg_a for any error
}
for (mem_addr=max-1; mem_addr>=0; addr--) {
    rd(mem_addr, tempreg);          // Access #14, expecting $000000
    reg_a = (tempreg OR reg_a); // Set bit in reg_a for any error
}
// Partial results are now in reg_a and reg_b
// reg_a: should be all 0's, will contain 1 for any bits that
//        read back as 1 when they should have read back as 0
// reg_b: should be all 1's, will contain 0 for any bits that
//        read back as 0 when they should have read back as 1
reg_b = $FFFFFF EXOR reg_b; // Toggle every bit of reg_b
result = reg_a OR reg_b;   // Done
```

APPENDIX II

Exemplary 4N Test.

```
//================================================================
// 4N version of the algorithm
reg_a = $000000;
reg_b = $FFFFFF;
for (mem_addr=0; mem_addr<max; addr++) {
    wr(mem_addr, $000000);          // Access #1
}
for (mem_addr=0; mem_addr<max; addr++) {
    rd(mem_addr, tempreg);          // Access #2, expecting $000000
    reg_a = (tempreg OR reg_a);     // Set bit in reg_a for any error
    wr(mem_addr, $FFFFFF);          // Access #3
    rd(mem_addr, tempreg);          // Access #4, expecting $FFFFFF
    reg_b = (tempreg AND reg_b);    // Clear bit in reg_b for any error
}
// Partial results are now in reg_a and reg_b
// reg_a: should be all 0's, will contain 1 for any bits that
//        read back as 1 when they should have read back as 0
// reg_b: should be all 1's, will contain 0 for any bits that
//        read back as 0 when they should have read back as 1
reg_b = $FFFFFF EXOR reg_b;   // Toggle every bit of reg_b
result = reg_a OR reg_b;   // Done
```

APPENDIX III

Exemplary, Non-limiting Embodiment of a POST Routine for Serially Testing 3 XRAMs and 3 YRAMs.

```
;///////////////////////////////////////////////////////
;       Includes
;///////////////////////////////////////////////////////
;///////////////////////////////////////////////////////
;       External Definitions
;///////////////////////////////////////////////////////
        global      BootPOST
;///////////////////////////////////////////////////////
;       External References
;///////////////////////////////////////////////////////
;///////////////////////////////////////////////////////
;       Equates
;///////////////////////////////////////////////////////
INSTANCE_SIZE   equ     $4000       ; 16k 24-bit words per RAM instance
HW_PXRAM_CFG    equ     $00FFE8     ; PXRAM Memory Config register
HW_PYRAM_CFG    equ     $00FFE9     ; PXRAM Memory Config register
;///////////////////////////////////////////////////////
;       X Memory
;///////////////////////////////////////////////////////
;///////////////////////////////////////////////////////
;       Y Memory
;///////////////////////////////////////////////////////
;///////////////////////////////////////////////////////
;       P Memory
;///////////////////////////////////////////////////////
        org     p,"BOOTROM_Post_P":
BootPOST
        ;//////////////////////////////////////////////
        ; Initialization
        ;//////////////////////////////////////////////
        move    #$3000,x0           ;
        move    x0,x:HW_PXRAM_CFG   ; Set PXRAM to be all X-memory
        move    x0,x:HW_PYRAM_CFG   ; Set PXRAM to be all X-memory
        ;//////////////////////////////////////////////
        ; Repair XRAM0 (x:$0000 to x:$3fff) = PXRAM2
        ;//////////////////////////////////////////////
        move    #$0000,r0           ; r0 = start pointer
        move    #$3fff,r3           ; r3 = end pointer
        jsr     bootpostx_sub       ;
        ; Move repair result into xram2 control register
        move a,x:$f5a5              ; PXRAM 2 repair mux sel reg
        ;//////////////////////////////////////////////
        ; Repair YRAM0 (y:$0000 to y:$3fff) = PYRAM2
        ;//////////////////////////////////////////////
        move    #$0000,r0           ; r0 = start pointer
        move    #$3fff,r3           ; r3 = end pointer
        jsr     bootposty_sub       ;
        ; Move repair result into yram2 control register
        move a,x:$f5a8              ; PYRAM 2 repair mux sel reg
        ;//////////////////////////////////////////////
        ; Repair XRAM1 (x:$4000 to x:$7fff) = PXRAM1
        ;//////////////////////////////////////////////
        move    #$4000,r0           ; r0 = start pointer
        move    #$7fff,r3           ; r3 = end pointer
        jsr     bootpostx_sub       ;
        ; Move repair result into xram1 control register
        move a,x:$f5a4              ; PXRAM 1 repair mux sel reg
        ;//////////////////////////////////////////////
        ; Repair YRAM1 (y:$4000 to y:$7fff) = PYRAM1
        ;//////////////////////////////////////////////
        move    #$4000,r0           ; r0 = start pointer
        move    #$7fff,r3           ; r3 = end pointer
        jsr     bootposty_sub       ;
        ; Move repair result into yram1 control register
        move a,x:$f5a7              ; PYRAM 1 repair mux sel reg
        ;//////////////////////////////////////////////
        ; Repair XRAM2 (x:$8000 to x:$bfff) = PXRAM0
        ;//////////////////////////////////////////////
        move    #$8000,r0           ; r0 = start pointer
        move    #$bfff,r3           ; r3 = end pointer
        jsr     bootpostx_sub       ;
        ; Move repair result into xram0 control register
        move a,x:$f5a3              ; PXRAM 0 repair mux sel reg
```

APPENDIX III-continued

Exemplary, Non-limiting Embodiment of a POST Routine
for Serially Testing 3 XRAMs and 3 YRAMs.

```
;//////////////////////////////////////////////////
; Repair YRAM2 (y:$8000 to y:$bfff) = PYRAM0
;//////////////////////////////////////////////////
        move        #$8000,r0              ; r0 = start pointer
        move        #$bfff,r3              ; r3 = end pointer
        jsr         bootposty_sub          ;
; Move repair result into yram0 control register
        move a,x:$f5a6                     ; PYRAM 0 repair mux sel reg
;//////////////////////////////////////////////////
; Tidy-up
;//////////////////////////////////////////////////
        move        #$1818,x0              ;
        move        x0,x:HW_PXRAM_CFG      ; Restore PXRAM to initial config
        move        x0,x:HW_PYRAM_CFG      ; Restore PYRAM to initial config
;//////////////////////////////////////////////////
; Finished (Exit POST)
;//////////////////////////////////////////////////
        rts                                ;
```

APPENDIX IV

Exemplary, Non-limiting Embodiment of a Subroutine for Testing XRAM.

```
;//////////////////////////////////////////////////////////////////////
; bootpostx_sub subroutine
;//////////////////////////////////////////////////////////////////////
bootpostx_sub
        ;//////////////////////////////////////////////////
        ; Initialization
        ;//////////////////////////////////////////////////
        ; When this subroutine is called, r0 = start address for RAM test
        move        #$000000,x0            ; Shortcut for $000000
        move        #$ffffff,x1            ; Shortcut for $ffffff
        clr         a                      ; a1 = $000000 at test end if no errors
        move        #$ffffff,b1            ; b1 = $ffffff at test end if no errors
        ;//////////////////////////////////////////////////
        ; for (addr=0; addr<max; addr++) {
        ;           wr(addr, $000000);    // Access #1
        ; }
        ;//////////////////////////////////////////////////
        move        #INSTANCE_SIZE/2,r2    ; r2 = loop counter
        move        r0,r1                  ; r1 = addr pointer
        do          r2,bootpostx_loop0     ; r2 = INSTANCE_SIZE/2
            move        x0,x:(r1)+         ; wr(addr, $000000);    // Access #1
            move        x0,x:(r1)+         ; wr(addr, $000000);    // Access #1
        ; 2 cycles per loop = 1 cycle per word
bootpostx_loop0
        ;//////////////////////////////////////////////////
        ; for (addr=0; addr<max; addr++) {
        ;           rd(addr, $000000);    // Access #2
        ;           wr(addr, $ffffff);    // Access #3
        ;           rd(addr, $ffffff);    // Access #4
        ; }
        ;//////////////////////////////////////////////////
        move        #INSTANCE_SIZE,r2      ; r2 = loop counter
        move        r0,r1                  ; r1 = addr pointer
        do          r2,bootpostx_loop1     ; r2 = INSTANCE_SIZE
            move        x:(r1),y0          ; rd(addr, $000000);    // Access #2
            or          y0,a               ; expect=$000000, save result in a1
            move        x1,x:(r1)          ; wr(addr, $ffffff);    // Access #3
            move        x:(r1)+,y0         ; rd(addr, $ffffff);    // Access #4
            and         y0,b               ; expect=$ffffff, save result in b1
        ; 5 cycles per loop
bootpostx_loop1
        ;//////////////////////////////////////////////////
        ; for (addr=0; addr<max; addr++) {
        ;           rd(addr, $ffffff);    // Access #5
        ;           wr(addr, $000000);    // Access #6
        ;           rd(addr, $000000);    // Access #7
        ; }
        ;//////////////////////////////////////////////////
        move        #INSTANCE_SIZE,r2      ; r2 = loop counter
        move        r0,r1                  ; r1 = addr pointer
```

APPENDIX IV-continued

Exemplary, Non-limiting Embodiment of a Subroutine for Testing XRAM.

```
            do      r2,bootpostx_loop2    ; r2 = INSTANCE_SIZE
                move    x:(r1),y0         ; rd(addr, $ffffff);      // Access #5
                and     y0,b              ; expect=$ffffff, save result in b1
                move    x0,x:(r1)         ; wr(addr, $000000);      // Access #6
                move    x:(r1)+,y0        ; rd(addr, $000000);      // Access #7
                or      y0,a              ; expect=$000000, save result in a1
            ; 5 cycles per loop
bootpostx_loop2
            ;//////////////////////////////////////////////////
            ; for (addr=max-1; addr>=0; addr--) {
            ;      rd(addr, $000000);         // Access #8
            ;      wr(addr, $ffffff);         // Access #9
            ;      rd(addr, $ffffff);         // Access #10
            ; }
            ;//////////////////////////////////////////////////
            move    #INSTANCE_SIZE,r2    ; r2 = loop counter
            move    r3,r1                ; r1 = addr pointer
            do      r2,bootpostx_loop3   ; r2 = INSTANCE_SIZE
                move    x:(r1),y0         ; rd(addr, $000000);      // Access #8
                or      y0,a              ; expect=$000000, save result in a1
                move    x1,x:(r1)         ; wr(addr, $ffffff);      // Access #9
                move    x:(r1)-,y0        ; rd(addr, $ffffff);      // Access #10
                and     y0,b              ; expect=$ffffff, save result in b1
            ; 5 cycles per loop
bootpostx_loop3
            ;//////////////////////////////////////////////////
            ; for (addr=max-1; addr>=0; addr--) {
            ;      rd(addr, $ffffff);         // Access #11
            ;      wr(addr, $000000);         // Access #12
            ;      rd(addr, $000000);         // Access #13
            ; }
            ;//////////////////////////////////////////////////
            move    #INSTANCE_SIZE,r2    ; r2 = loop counter
            move    r3,r1                ; r1 = addr pointer
            do      r2,bootpostx_loop4   ; r2 = INSTANCE_SIZE
                move    x:(r1),y0         ; rd(addr, $ffffff);      // Access #11
                and     y0,b              ; expect=$ffffff, save result in b1
                move    x0,x:(r1)         ; wr(addr, $000000);      // Access #12
                move    x:(r1)-,y0        ; rd(addr, $000000);      // Access #13
                or      y0,a              ; expect=$000000, save result in a1
            ; 5 cycles per loop
bootpostx_loop4
            ;//////////////////////////////////////////////////
            ; for (addr=max-1; addr>=0; addr--) {
            ;      rd(addr, $000000);         // Access #14
            ; }
            ;//////////////////////////////////////////////////
            move    #INSTANCE_SIZE,r2    ; r2 = loop counter
            move    r3,r1                ; r1 = addr pointer
            do      r2,bootpostx_loop5   ; r2 = INSTANCE_SIZE
                move    x:(r1)-,y0        ; rd(addr, $000000);      // Access #14
                or      y0,a              ; expect=$000000, save result in a1
            ; 2 cycles per loop
bootpostx_loop5
            ;//////////////////////////////////////////////////
            ; Tidy up
            ;//////////////////////////////////////////////////
            eor     x1,b1                ;
            move    b1,x1                ; Cannot OR b1 & a1, must move first
            or      x1,a                 ; Result is in a1
            neg     a                    ; 2's Compliment for mux Sel
            ;//////////////////////////////////////////////////
            ; Finished
            ;//////////////////////////////////////////////////
        rts
```

What is claimed is:

1. A method comprising:

performing a first initializing operation on a memory comprising a plurality of bits to initialize each bit of the plurality of bits to zero;

initializing a first register to all zeros;

retrieving a value, for each of the plurality of bits from the memory after performing the first initializing operation;

applying a logical OR operation to each of the retrieved values with the retrieved value as a first operand and a corresponding value of the first register as a second operand to produce a result value for each application of the logical OR operation;

performing a second initializing operation on the memory to initialize each bit of the plurality of bits to one;

initializing a second register to all ones;

retrieving a value for each of the plurality of bits from the memory after performing the second initializing operation; and applying a logical AND operation to each of the retrieved values with the retrieved value as a first operand and a corresponding value of the second register as a second operand to produce a result value for each application of the logical AND operation.

2. The method of claim 1, further comprising:
determining whether a result value of applying the logical OR operation is equal to one or whether a result value of applying the logical AND operation is equal to zero.

3. The method of claim 1, wherein the method is performed during a boot sequence of a device in which the memory is installed.

4. The method of claim 1, wherein the method is performed in a portable electronic device in which the memory is installed.

5. The method of claim 4, wherein the portable electronic device comprises a device for playing media stored using a moving picture experts group audio layer 3 ("MP3") format.

6. The method of claim 1, further comprising:
storing result values of applying the logical OR operation in the first register; and
storing result values of applying the logical AND operation in the second register.

7. The method of claim 6, further comprising
creating a repair control register from the first register and the second register.

8. The method of claim 7, wherein the repair control register is a binary register having switch values for multiplexers for reading the memory and having switch values for multiplexers for writing to the memory.

9. The method of claim 7, further comprising using the repair control register to bypass a failed bit during operation of a device in which the memory is installed.

10. A system comprising:
a memory device comprising a plurality of bits;
a processor coupled to the memory system, the processor having access to a test routine executable by the processor, the test routine including instructions to:
perform a first initializing operation on the memory device to initialize each bit of the plurality of bits to zero;
initialize a first register to all zeros;
retrieve a value for each of the plurality of bits from the memory device after performing the first initializing operation;
apply a logical OR operation to each of the retrieved values with the retrieved value as a first operand and a corresponding value of the first register as a second operand to produce a result value for each application of the logical OR operation;
perform a second initializing operation on the memory device to initialize each bit of the plurality of bits to one;
initialize a second register to all ones;
retrieve a value for each of the plurality of bits from the memory device after performing the second initializing operation; and
apply a logical AND operation to each of the retrieved values with the retrieved value as a first operand and a corresponding value of the second register as a second operand to produce a result value for each application of the logical AND operation.

11. The system of claim 10, wherein the memory device comprises a plurality of multiplexers for reading the plurality of bits and for writing to the plurality of bits.

12. The system of claim 10, further comprising:
a plurality of multiplexers for reading the plurality of bits and for writing to the plurality of bits; and
a repair control register having switch values for the plurality of multiplexers, wherein the repair control register can switch the multiplexers to ensure that a failed bit does not get written to or read from during operation of the system.

13. The system of claim 10, further comprising:
a plurality of multiplexers for reading the plurality of bits and for writing to the plurality of bits; wherein the test routine includes instructions to:
store result values of applying the logical OR operation in the first register;
store result values of applying the logical AND operation in the second register;
combine the first register and the second register to yield a repair control register; and
apply the repair control register to the plurality of multiplexers.

14. The system of claim 10, wherein the test routine includes instructions to:
store result values of applying the logical OR operation in the first register;
store result values of applying the logical AND operation in the second register;
toggle each bit of the second register; and
apply a logical OR operation with the first register as the first operand and the second register as the second operand.

* * * * *